United States Patent [19]

Park et al.

[11] Patent Number: 5,444,010
[45] Date of Patent: Aug. 22, 1995

[54] METHOD FOR FORMING A STACKED CAPACITOR IN A SEMICONDUCTOR DEVICE

[75] Inventors: Sang Hoon Park, Kyungki-do; Ho Young Choi, Seoul, both of Rep. of Korea

[73] Assignee: Hyundai Electronics Industries, Ltd., Kyungki-do, Rep. of Korea

[21] Appl. No.: 242,398

[22] Filed: May 13, 1994

[30] Foreign Application Priority Data

May 13, 1993 [KR] Rep. of Korea ............... 93-8193

[51] Int. Cl.⁶ ......................................... H01L 21/8242
[52] U.S. Cl. ..................................... 437/60; 437/47; 437/52; 437/919
[58] Field of Search ............. 437/47, 48, 52, 60, 437/233, 919; 257/308

[56] References Cited

U.S. PATENT DOCUMENTS 5,084,405  1/1992  Fazan et al. .................. 437/52

FOREIGN PATENT DOCUMENTS 0260453  10/1990  Japan .......................... 437/52

Primary Examiner—Tom Thomas
Attorney, Agent, or Firm—Pennie & Edmonds

[57] ABSTRACT

This invention relates to a method for forming a stacked capacitor in a semiconductor device. This invention can increase the capacitance of a capacitor by planarizing a polysilicon layer for a charge storage electrode and forming a recess on the planarized polysilicon layer.

5 Claims, 3 Drawing Sheets

METHOD FOR FORMING A STACKED CAPACITOR IN A SEMICONDUCTOR DEVICE

FIELD OF THE INVENTION

This invention relates to a method for forming a stacked capacitor in a semiconductor device, and more particularly, to a method for increasing the capacitance of a capacitor by planarizing a polysilicon layer for a charge storage electrode and forming a recess on the planarized polysilicon layer.

BACKGROUND

Generally, as the semiconductor device becomes more integrated, the effective area of the capacitor must be decreased. Therefore, the capacitor must be manufactured with a larger capacitance in a limited effective area.

Therefore, it is the object of the present invention to provide a method for forming a stacked capacitor in a semiconductor device which can increase the memory capacity in a semiconductor device as the capacitance of the capacitor in the limited effective area of the capacitor increases.

SUMMARY OF THE INVENTION

To achieve the above object and other advantages, in the present invention, a field oxide layer is formed on a silicon substrate. A gate oxide layer, a gate electrode layer and an insulating layer are sequentially formed on the silicon substrate. The gate oxide layer, the gate electrode, layer and the insulating layer are etched to form a gate electrode. An impurity region is formed on the silicon substrate. An oxide spacer is formed on the side wall of the gate electrode. A first oxide layer, a nitride layer and a second oxide layer are formed on the silicon substrate including on the gate electrode and the oxide spacer. A portion of the first oxide layer, nitride layer and second oxide layer are etched using a first mask so as to expose the impurity region, thereby forming a contact hole. A first polysilicon layer is deposited on the second oxide layer and the contact hole. The first polysilicon layer is then planarized. A portion of the first polysilicon layer is etched using a second mask to depth that does not expose the second oxide layer. A third oxide layer and a photoresist are sequentially formed on the first polysilicon layer, and then the photoresist is patterned to expose portions of the third oxide layer. The third oxide layer and the first polysilicon layer are sequentially etched to expose both side portions of the second oxide layer, thereby forming multiple recesses on the center of the first polysilicon layer and on the second oxide layer. The photoresist is then removed. A second polysilicon layer is deposited on the third oxide layer including on the recesses. The second polysilicon layer is etched to form a polysilicon spacer on each inner wall of the recesses. The third oxide layer and the second oxide layer are removed, thereby forming a charge storage electrode. A capacitor dielectric layer is formed on the surface of the charge storage electrode. A plate electrode is formed on the surface of the capacitor dielectric layer.

BRIEF DESCRIPTION OF THE DRAWINGS

The present invention will now be described with reference to the attached drawings, in which.

DETAILED DESCRIPTION OF THE INVENTION

Figure 1A:
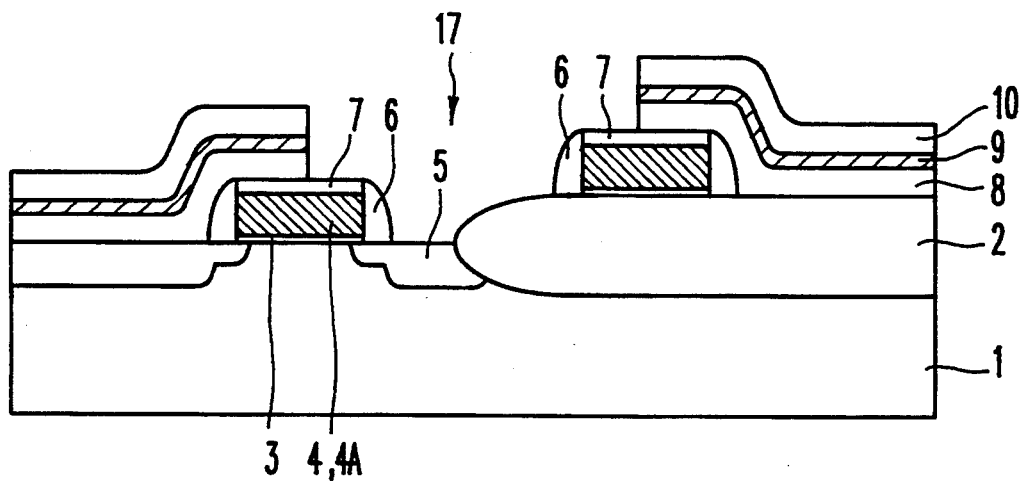
FIGS. 1A to 1F illustrate the sequential fabrication process for forming a stacked capacitor in a semiconductor device according to the present invention.

Referring to FIG. 1A, a field oxide layer 2 is formed on a silicon substrate. A gate oxide layer 3, a gate electrode layer 4 and an insulating layer 7 are sequentially formed on the silicon substrate 1. The gate oxide layer 3, the gate electrode layer 4 and the insulating layer 7 are etched to form a gate electrode 4A. An impurity region 5 for a source or drain electrode is formed on the silicon substrate 1. An oxide spacer 6 is formed on the side wall of the gate electrode 4A. A first oxide layer 8, a nitride layer 9 and a second oxide layer 10 are sequentially formed on the silicon substrate 1 including on the gate electrode 4A and the oxide spacer 6. A portion of the first oxide layer 8, nitride layer 9 and second oxide layer 10 is etched using a first mask (not shown), thereby forming a contact hole 17.

Figure 1B:
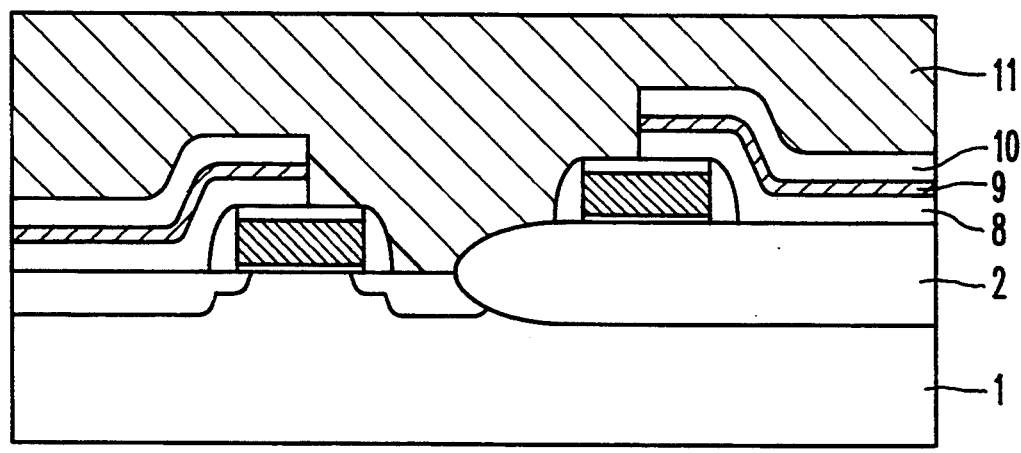

Referring to FIG. 1B, a first polysilicon layer 11 is deposited and planarized on the second oxide layer 10 and the contact hole 17.

Figure 1C:
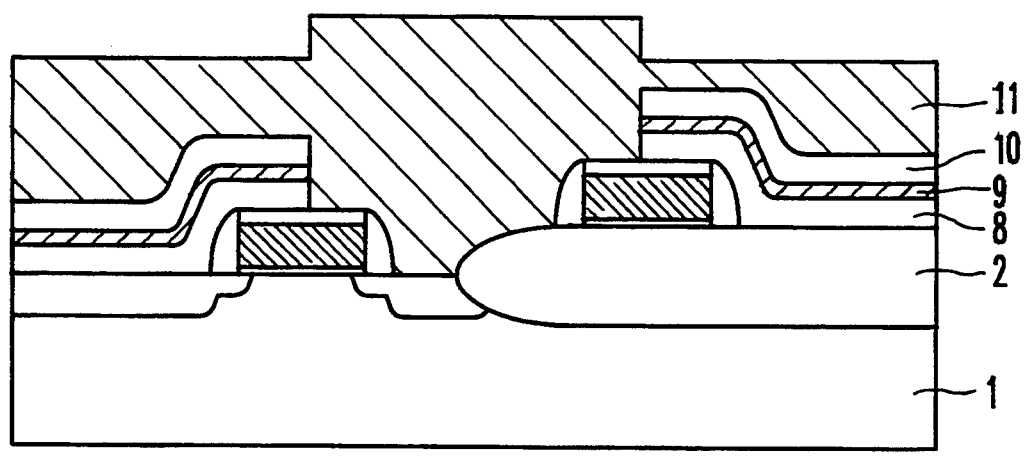

Referring to FIG. 1C, a portion of the first polysilicon layer 11 is etched using a second mask (not shown) to a depth that does not expose the second oxide layer 10. The second mask forms a pattern inverse of the pattern formed by the first mask.

Figure 1D:
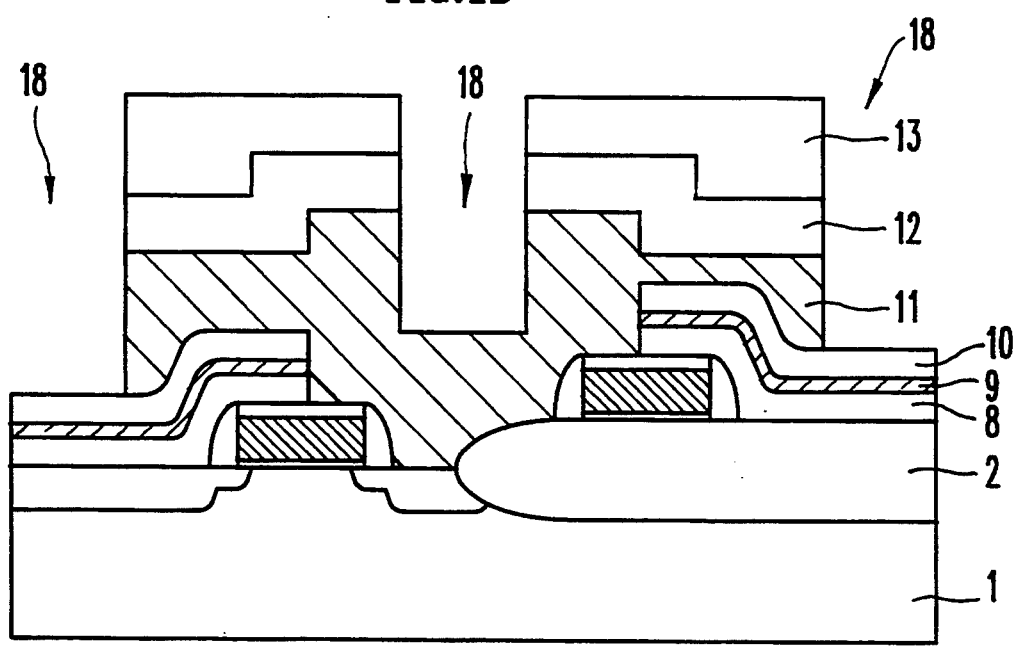

Referring to FIG. 1D, a third oxide layer 12 and a photoresist 13 are sequentially formed on the first polysilicon layer 11. The photoresist 13 is patterned to expose portions of the third oxide layer 12. The third oxide layer 12 and the first polysilicon layer 11 exposed by the patterned photoresist 13 are sequentially etched by employing a dry-etching process to expose both side portions of the second oxide layer 10, thereby forming numerous recesses 18 on the center of the first polysilicon layer 11 and on both sides of the second oxide layer 10.

Figure 1E:
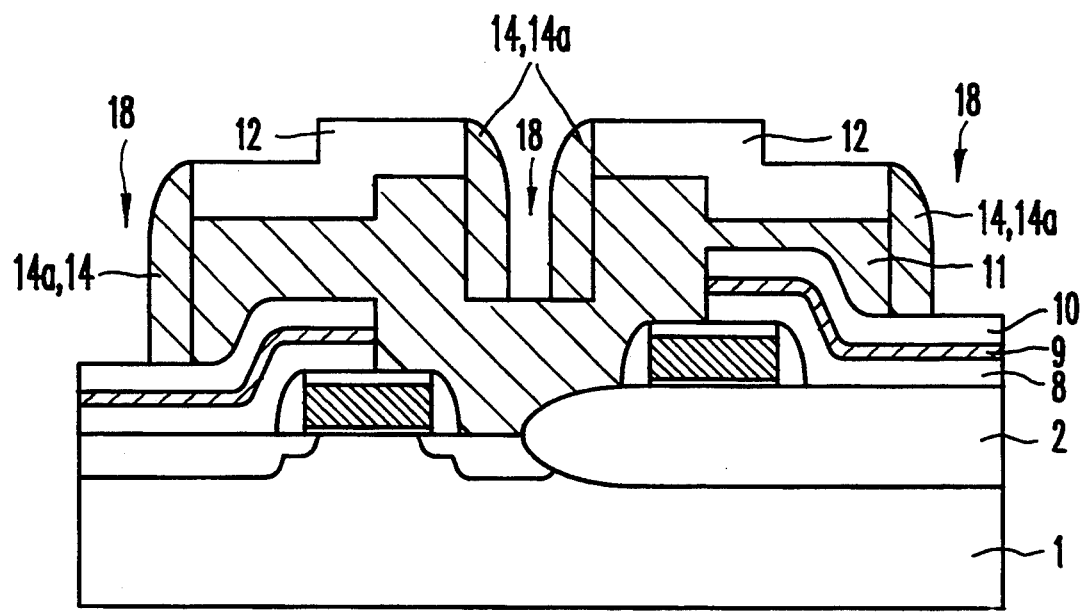

Referring to FIG. 1E, the photoresist 13 is removed. Then, a second polysilicon layer 14 is deposited on the third oxide layer 12 including on the recesses 18. The second polysilicon layer 14 is anisotropically etched by an anisotropic etching process to form a polysilicon spacer 14a on each inner wall of the recesses 18.

Figure 1F:
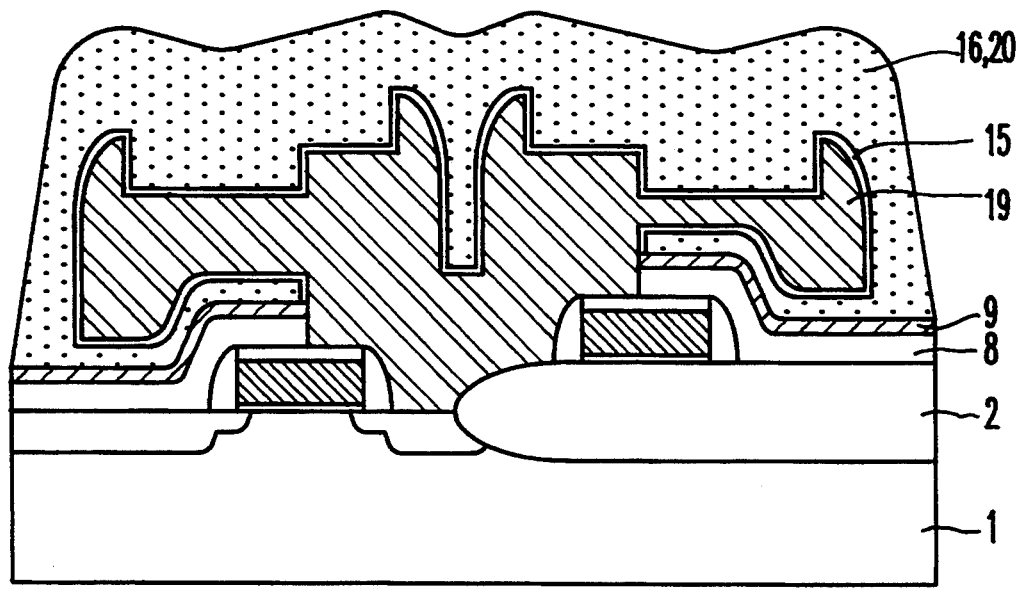

Referring to FIG. 1F, the third oxide layer 12 and the second oxide layer 10 are removed by means of a wet-etching process, thereby forming a charge storage electrode 19 which is comprised of the first polysilicon layer 11 and the polysilicon spacer 14a. A capacitor dielectric layer 15 is formed on the surface of the charge storage electrode 19. A plate electrode 20 is formed on the surface of the capacitor dielectric layer 15. The nitride layer 9 is used as an etching barrier during the wet-etching process.

As described above, according to the present invention, the capacitor increases the memory capacity in a semiconductor device by increasing the capacitance of a capacitor.

Although this invention has been described in its preferred embodiment with a certain degree of particularity, one skilled in the art should know that the preferred embodiment disclosed herein is only an example and that the construction, combination and arrangement of its parts may be varied without departing from the spirit and scope of the present invention.

What is claimed is:

1. A method for forming a stacked capacitor in a semiconductor device, comprising the steps of:

forming a field oxide layer on a silicon substrate;

sequentially forming a gate oxide layer, a gate electrode layer and an insulating layer on said silicon substrate;

etching said gate oxide layer, said gate electrode layer and said insulating layer to form a gate electrode;

forming an impurity region on said silicon substrate;

forming oxide spacers on exposed areas of said gate electrode side walls;

sequentially forming a first oxide layer, a nitride layer and a second oxide layer on said silicon substrate including on said gate electrode and said oxide spacers;

etching a portion of said first oxide layer, nitride layer and second oxide layer using a first mask to expose a portion of said impurity region, thereby forming a contact hole;

depositing a first polysilicon layer on said second oxide layer and said contact hole, and planarizing said first polysilicon layer;

etching portions of said first polysilicon layer using a second mask to a depth that does not expose said second oxide layer;

sequentially forming a third oxide layer and a photoresist on said first polysilicon layer, and then patterning said photoresist to expose portions of said third oxide layer;

sequentially etching exposed areas of said third oxide layer and said first polysilicon layer to expose portions of said second oxide layer and said first polysilicon and forming recesses adjacent said first polysilicon layer and in said first polysilicon;

removing said photoresist and then depositing a second polysilicon layer on said third oxide layer including on said recesses;

etching said second polysilicon layer to form a polysilicon spacer on each inner wall of said recesses;

removing said third oxide layer and said second oxide layer to form a charge storage electrode;

forming a capacitor dielectric layer on the surface of said charge storage electrode; and forming a plate electrode on the surface of said capacitor dielectric layer.

2. A method as claimed in claim 1, wherein said third oxide layer and said first polysilicon layer exposed by said pattern photoresist is etched by means of a dry-etching process.

3. A method as claimed in claim 1, wherein said polysilicon spacers are formed by the anisotropic etching process.

4. A method as claimed in claim 1, wherein said third oxide layer and second oxide layer are removed by a wet-etching process.

5. A method as claimed in claim 1, wherein said second mask forms a pattern substantially inverse of the pattern formed by said first mask.

* * * * *